(12) United States Patent
Lee et al.

(10) Patent No.: US 12,326,711 B2
(45) Date of Patent: Jun. 10, 2025

(54) METHOD AND COMPUTING DEVICE FOR MANUFACTURING SEMICONDUCTOR DEVICE

(71) Applicant: SAMSUNG ELECTRONICS CO., LTD., Suwon-si (KR)

(72) Inventors: Sooyong Lee, Yongin-si (KR); Mi-Jin Kwon, Anyang-si (KR); Dongho Kim, Hwaseong-si (KR); Seunghune Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 610 days.

(21) Appl. No.: 17/566,151

(22) Filed: Dec. 30, 2021

(65) Prior Publication Data
US 2022/0382249 A1    Dec. 1, 2022

(30) Foreign Application Priority Data

May 20, 2021    (KR) .......................... 10-2021-0065022

(51) Int. Cl.
*G05B 19/4099*    (2006.01)
(52) U.S. Cl.
CPC ............ *G05B 19/4099* (2013.01); *G05B 2219/45031* (2013.01)
(58) Field of Classification Search
CPC ...... G05B 19/4099; G05B 2219/45031; G03F 1/70; G03F 7/70441; G03F 7/70466; G03F 7/705; G03F 1/36; G03F 7/706841; G06N 20/00; H01L 21/3086
USPC .......................................................... 700/5
See application file for complete search history.

(56) References Cited

U.S. PATENT DOCUMENTS

| 7,849,423 | B1* | 12/2010 | Yenikaya ................. G03F 1/36 716/55 |
| 8,863,048 | B1  | 10/2014 | Gerousis et al. |
| 8,910,094 | B2  | 12/2014 | Sun et al. |
| 8,972,907 | B1  | 3/2015  | Yokoyama et al. |
| 9,672,320 | B2  | 6/2017  | Chang et al. |
| 10,670,973 | B2 | 6/2020  | Zou et al. |
| 2010/0191357 | A1 | 7/2010 | Maeda et al. |
| 2013/0219349 | A1* | 8/2013 | Lee .......................... G03F 1/36 716/53 |
| 2016/0306914 | A1* | 10/2016 | Kang ................... G03F 7/70433 |
| 2019/0155169 | A1* | 5/2019 | Moon .................. G03F 7/70625 |

(Continued)

FOREIGN PATENT DOCUMENTS

JP    5355112 B2    11/2013

*Primary Examiner* — Thomas C Lee
*Assistant Examiner* — Michael Tang
(74) *Attorney, Agent, or Firm* — Sughrue Mion, PLLC

(57) ABSTRACT

A method for manufacturing a semiconductor device, includes receiving a first layout including patterns for the manufacturing of the semiconductor device, generating a second layout by performing machine learning-based process proximity correction (PPC) based on features of the patterns of the first layout, generating a third layout by performing optical proximity correction (OPC) on the second layout, and performing a multiple patterning process based on the third layout. The multiple patterning process includes patterning first-type patterns, and patterning second-type patterns. The machine learning-based process proximity correction is performed based on features of the first-type patterns and features of the second-type patterns.

20 Claims, 16 Drawing Sheets

(56) References Cited

U.S. PATENT DOCUMENTS

| | | |
|---|---|---|
| 2019/0250503 A1* | 8/2019 | Wu .......................... G03F 1/70 |
| 2020/0133117 A1* | 4/2020 | Chu .......................... G03F 1/70 |
| 2020/0320246 A1 | 10/2020 | Wang et al. |
| 2021/0132486 A1* | 5/2021 | Melvin, III ............... G03F 1/20 |
| 2021/0334444 A1 | 10/2021 | Lee et al. |
| 2022/0179321 A1* | 6/2022 | Ma ....................... G06T 7/0004 |
| 2022/0299881 A1* | 9/2022 | Zheng .................... G03F 7/705 |

* cited by examiner

METHOD AND COMPUTING DEVICE FOR MANUFACTURING SEMICONDUCTOR DEVICE

CROSS-REFERENCE TO RELATED APPLICATIONS

This application claims priority under 35 U.S.C. § 119 to Korean Patent Application No. 10-2021-0065022 filed on May 20, 2021, in the Korean Intellectual Property Office, the disclosure of which is incorporated by reference herein in its entirety.

BACKGROUND

Embodiments of the present disclosure described herein relate to a semiconductor device, and more particularly, relate to a method and a computing device for generating a layout, which is used to manufacture a semiconductor device, such that accuracy and resolution are improved.

A semiconductor process for manufacturing a semiconductor device is implemented by a combination of various procedures such as etching, depositing, planarization, growth, implanting, etc. The etching may be performed by forming a pattern of a photo resist on a target and removing portions of the target, which are not covered by the photo resist, by using chemicals, gas, plasma, ion beam, etc.

A process error may occur due to various factors in the process of performing the etching. The factors causing the process error may come from a feature of a semiconductor pattern implemented by a photo resist pattern or etching, in addition to a process feature. The process error coming from the feature of the pattern may be compensated for by revising or changing a layout of patterns.

As a semiconductor device is highly integrated and a nano-scale manufacturing technology is applied to a semiconductor process, the number of patterns included in a semiconductor layout is sharply increasing. Accordingly, the amount of computation for revising or changing a layout of patterns may also sharply increase to compensate for a process error.

SUMMARY

Embodiments of the present disclosure provide a method and a computing device for generating a layout, which is used to manufacture a semiconductor device, such that a resolution is improved and the amount of computation is reduced.

According to an aspect of an example embodiment, there is provided a method for manufacturing a semiconductor device, the method including: receiving a first layout including a plurality of patterns of the semiconductor device; generating a second layout by performing machine learning-based process proximity correction (PPC) based on features of the plurality of patterns of the first layout; generating a third layout by performing optical proximity correction (OPC) on the second layout; and performing a multiple patterning process based on the third layout, wherein the performing the multiple patterning process includes: performing a first patterning process on first-type patterns among the plurality of patterns; and performing a second patterning process on second-type patterns among the plurality of patterns, and wherein the machine learning-based process proximity correction is performed based on first features of the first-type patterns and second features of the second-type patterns.

According to an aspect of an example embodiment, there is provided a method for manufacturing a semiconductor device, the method including: receiving a first layout including a plurality of patterns of the semiconductor device; generating a first image corresponding to first-type patterns among the plurality of patterns of the first layout; generating a second image corresponding to second-type patterns among the plurality of patterns of the first layout; generating a second layout by performing deep learning-based process proximity correction (PPC) based on the first image and the second image; generating a third layout by performing optical proximity correction (OPC) on the second layout; and performing a multiple patterning process based on the third layout, wherein performing the multiple patterning process includes: performing a first patterning process on the first-type patterns; and performing a second patterning process on the second-type patterns.

According to an aspect of an example embodiment, there is provided a computing device including: a memory storing instructions; and one or more processors configured to execute the instructions to: receive a first layout including a plurality of patterns of a semiconductor device; generate a second layout by performing machine learning-based process proximity correction (PPC) based on features of the plurality of patterns of the first layout; generate a third layout by performing optical proximity correction (OPC) on the second layout; and perform a multiple patterning process based on the third layout, wherein the multiple patterning process includes a first patterning process performed on first-type patterns among the plurality of patterns and a second patterning process performed on second-type patterns among the plurality of patterns, and wherein the machine learning-based process proximity correction is performed based on features of the first-type patterns and features of the second-type patterns.

BRIEF DESCRIPTION OF THE FIGURES

The above and other objects and features of the present disclosure will become apparent by describing in detail example embodiments thereof with reference to the accompanying drawings, in which.

DETAILED DESCRIPTION

Below, example embodiments of the present disclosure may be described in detail and clearly to such an extent that an ordinary one in the art easily implements the present disclosure.

Figure 1:
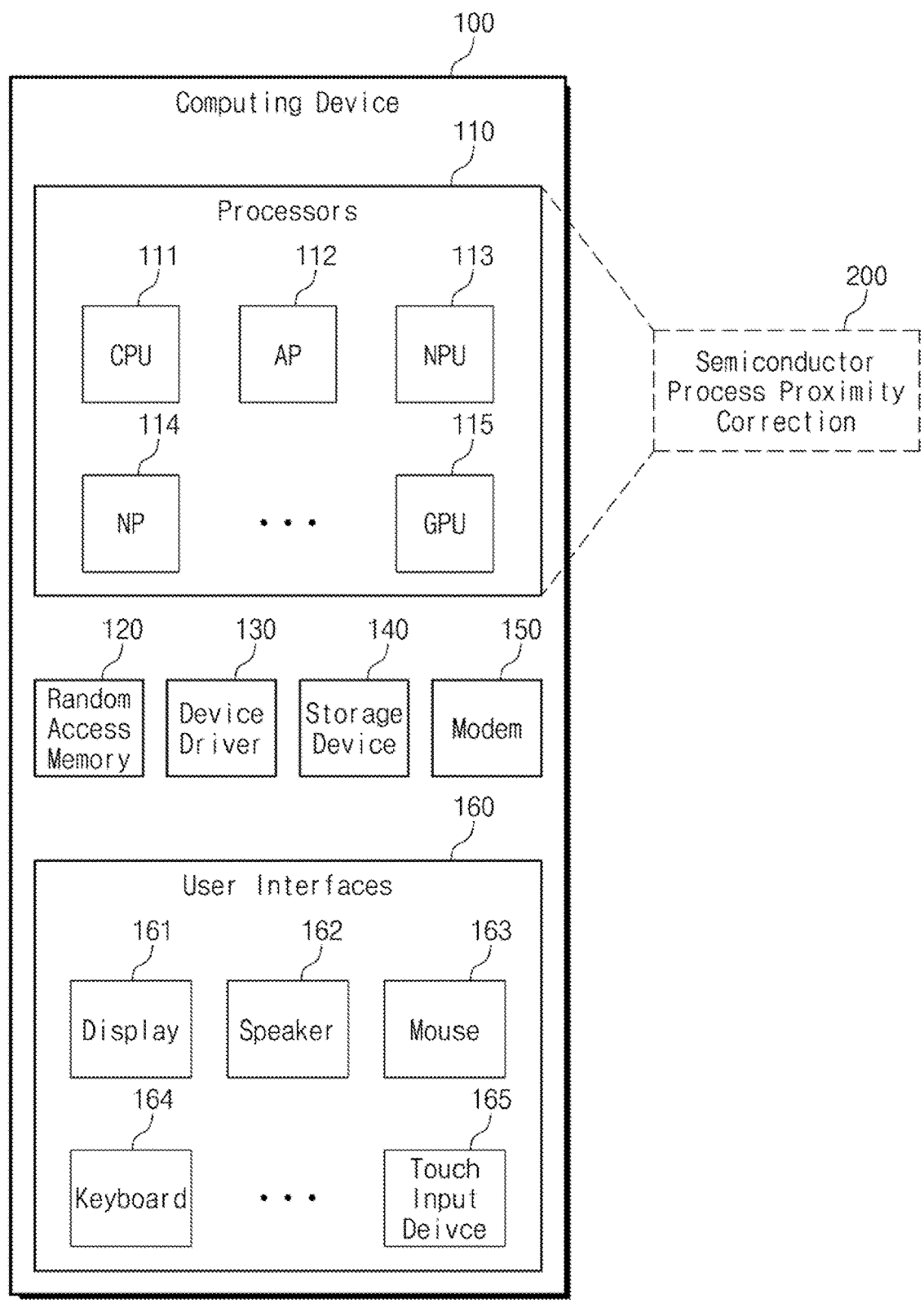
FIG. 1 is a block diagram illustrating a computing device according to an example embodiment of the present disclosure.

FIG. 1 is a block diagram illustrating a computing device 100 according to an example embodiment of the present disclosure. Referring to FIG. 1, the computing device 100 includes processors 110, a random access memory (RAM) 120, a device driver 130, a storage device 140, a modem 150, and user interfaces 160.

According to an example embodiment, one or more processors 110 may execute a semiconductor process proximity correction module 200. The semiconductor process proximity correction module 200 may perform the generation of a layout for manufacturing a semiconductor device, based on machine learning or deep learning. For example, the semiconductor process proximity correction module 200 may be implemented in the form of instructions (or codes) that are executed by at least one of the processors 110. In this case, the at least one processor may load the instructions (or codes) of the semiconductor process proximity correction module 200 onto the random access memory 120.

According to another example embodiment, the one or more processors may be manufactured to implement the semiconductor process proximity correction module 200. According to another example embodiment, the one or more processors may be manufactured to implement various machine learning or deep learning modules. The one or more processors may implement the semiconductor process proximity correction module 200 by receiving information (e.g., instructions or codes) corresponding to the semiconductor process proximity correction module 200.

According to another example embodiment, the processors 110 may include, for example, at least one general-purpose processor such as a central processing unit (CPU) 111 or an application processor (AP) 112. Also, the processors 110 may further include at least one special-purpose processor such as a neural processing unit (NPU) 113, a neuromorphic processor (NP) 114, or a graphics processing unit (GPU) 115. The processors 110 may include two or more homogeneous processors. However, the disclosure is not limited thereto, and as such, according to another example embodiment other processing circuits may be implemented as the processor.

The random access memory 120 may be used as a working memory of the processors 110 and may be used as a main memory or a system memory of the computing device 100. The random access memory 120 may include a volatile memory such as a dynamic random access memory or a static random access memory or a nonvolatile memory such as a phase-change random access memory, a ferroelectric random access memory, a magnetic random access memory, or a resistive random access memory.

The device driver 130 may control the following peripheral devices depending on a request of the processors 110: the storage device 140, the modem 150, and the user interfaces 160. The storage device 140 may include a stationary storage device such as a hard disk drive or a solid state drive, or a removable storage device such as an external hard disk drive, an external solid state drive, or a removable memory card.

The modem 150 may provide remote communication with an external device. The modem 150 may perform wired or wireless communication with the external device. The modem 150 may communicate with the external device based on at least one of various communication schemes such as Ethernet, wireless-fidelity (Wi-Fi), long term evolution (LTE), and 5th generation (5G) mobile communication.

The user interfaces 160 may receive information from a user and may provide information to the user. The user interfaces 160 may include at least one user output interface such as a display 161 or a speaker 162, and at least one user input interface such as a mouse 163, a keyboard 164, or a touch input device 165.

The instructions (or codes) of the semiconductor process proximity correction module 200 may be received through the modem 150 and may be stored in the storage device 140. The instructions (or codes) of the semiconductor process proximity correction module 200 may be stored in a removable storage device, and the removable storage device may be connected with the computing device 100. The instructions (or codes) of the semiconductor process proximity correction module 200 may be loaded from the storage device 140 onto the random access memory 120 and may be executed on the random access memory 120.

Figure 2:
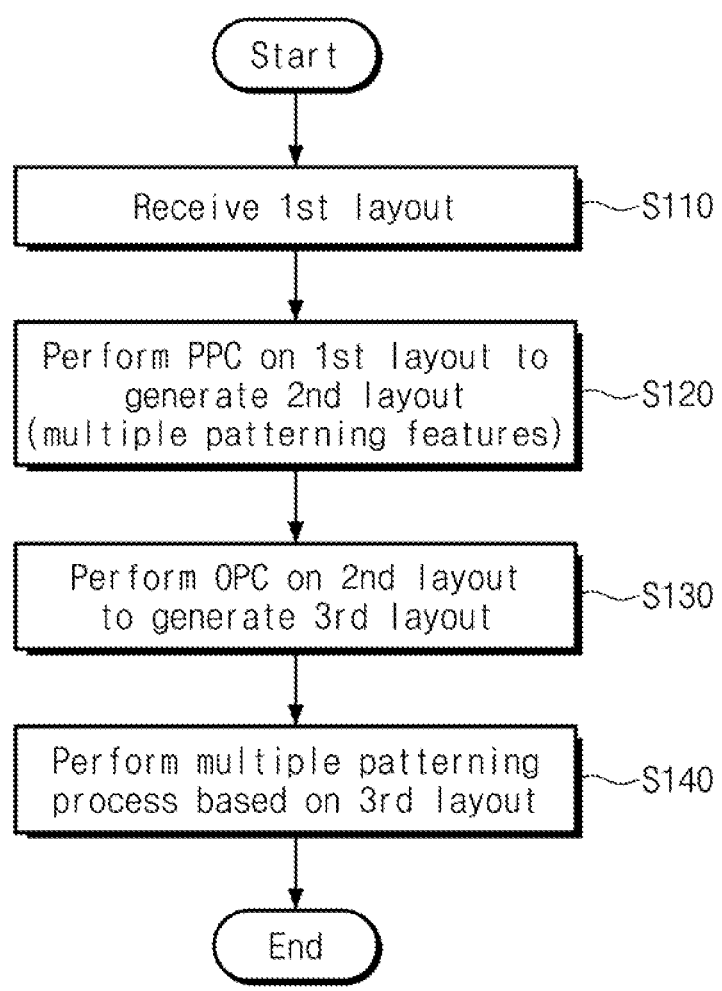
FIG. 2 illustrates an example in which a semiconductor process proximity correction module of FIG. 1 performs the generation of a layout.

FIG. 2 illustrates an example in which the semiconductor process proximity correction module 200 of FIG. 1 performs the generation of a layout. Referring to FIGS. 1 and 2, according to an example embodiment, in operation S110, the semiconductor process proximity correction module 200 may receive a first layout. For example, the first layout may be a target layout to be obtained in an after cleaning inspection (ACI).

In operation S120, the semiconductor process proximity correction module 200 may perform process proximity correction (PPC) on the first layout to generate a second layout. According to an example embodiment, semiconductor patterns corresponding to the first layout may be formed based on multiple patterning processes. Each of the multiple patterning processes may include a photo lithography process of generating a photo resist mask and an etching process of etching a portion exposed by the photo resist mask. That is, the multiple patterning process may include the iterations of the photo lithography process and the etching process.

The process proximity correction may include performing machine learning or deep learning-based correction on patterns of the multiple patterning processes and/or features of the patterns of the multiple patterning processes. The second layout may be a target layout of the photo resist mask to be obtained in an after development inspection (ADI).

The process proximity correction may correct a change in a shape of a semiconductor pattern due to an influence of features of patterns and an influence of an etching skew when performing the etching process in each of the multiple patterning processes. For example, the process proximity correction may, in advance, correct a change in a shape in etching by varying, in advance, a shape of a portion of a specific pattern, at which a change in a shape is expected, and applying the varied result to a layout.

In operation S130, the semiconductor process proximity correction module 200 may perform optical proximity correction (OPC) on the second layout to generate a third layout. The third layout may be a target layout of the photo resist mask that is generated through the photo lithography process. The third layout may be a layout to which both the process proximity correction and the optical proximity correction are applied.

The optical proximity correction may correct a change in a shape of patterns of the photo resist mask due to an influence of features of the patterns of the photo resist mask and an influence of a skew. For example, the optical proximity correction may, in advance, correct a change in a shape in the photo lithography process by varying, in advance, a shape of a portion of a specific pattern, at which a change in a shape is expected, and applying the varied result to a layout.

In operation S140, a multiple patterning process may be performed based on the third layout. For example, the photo lithography process may be performed based on some of the patterns of the patterns of the third layout, and thus, a first photo resist mask corresponding to the some patterns may be formed on a target (e.g., a target of a semiconductor process to be manufactured as a semiconductor device). The etching process may be performed by using the first photo resist mask, and exposed portions of the target, which are not covered by the photo resist mask, may be removed through the etching process.

Afterwards, the photo lithography process may be performed based on the remaining patterns (or some of the other patterns) of the patterns of the third layout, and thus, a second photo resist mask corresponding to the remaining patterns may be formed on the target (e.g., a target of a semiconductor process to be manufactured as a semiconductor device). The etching process may be performed by using the second photo resist mask, and exposed portions of the target, which are not covered by the photo resist mask, may be removed through the etching process. The photo lithography process and the etching process may be repeated as much as the number of times defined by the rule of the multiple patterning process.

Figure 3:
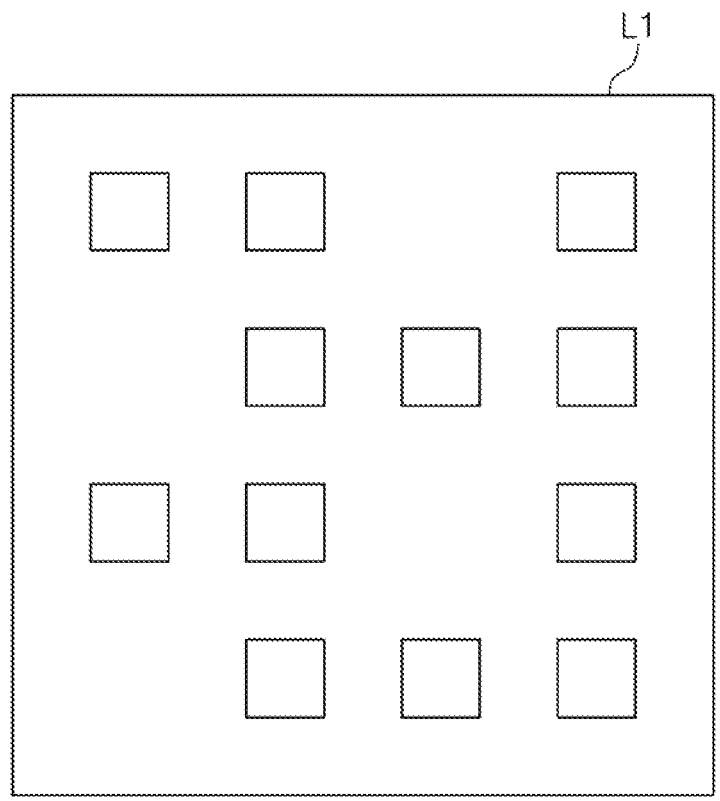
FIG. 3 illustrates an example of a first layout.

FIG. 3 illustrates an example of a first layout L1. Referring to FIGS. 2 and 3, the first layout L1 may include quadrangular patterns. For example, the quadrangular patterns may be patterns of vias. That is, the first layout L1 may be a layout for generating vias. The first layout L1 may be a target layout to be obtained in an after cleaning inspection (ACI).

Figure 4:
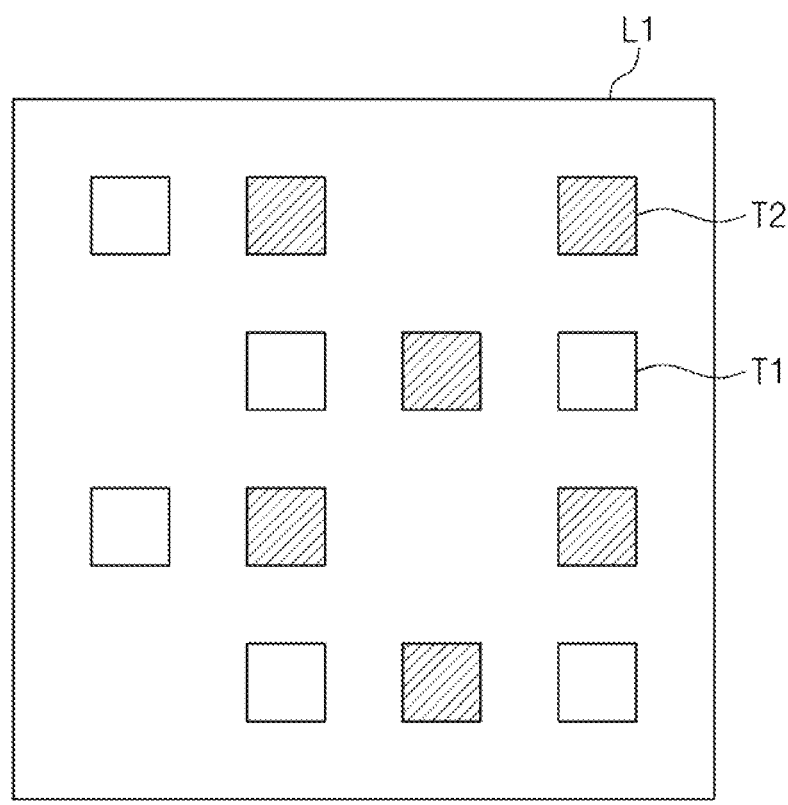
FIG. 4 illustrates an example in which patterns of a first layout are classified into different types of patterns by a rule of a multiple patterning process.

FIG. 4 illustrates an example in which patterns of the first layout L1 are classified into different types of patterns by a rule of a multiple patterning process. According to an example embodiment, the patterns of the first layout L1 may be classified into patterns of a first type T1 and patterns of a second type T2. In FIG. 4, the patterns of the second type T2 are shown to be filled with an oblique line.

The patterns of the first type T1 may correspond to one photo lithography process and one etching process. The patterns of the second type T2 may correspond to another photo lithography process and another etching process. According to an example embodiment, the patterns of the first type T1 and the patterns of the second type T2 may be defined such that a space between the patterns of the first type T1 or a space between the patterns of the second type T2 is greater than a space between all the patterns of the first layout L1. That is, the multiple patterning process may improve a resolution of patterns of a semiconductor device.

Figure 5:
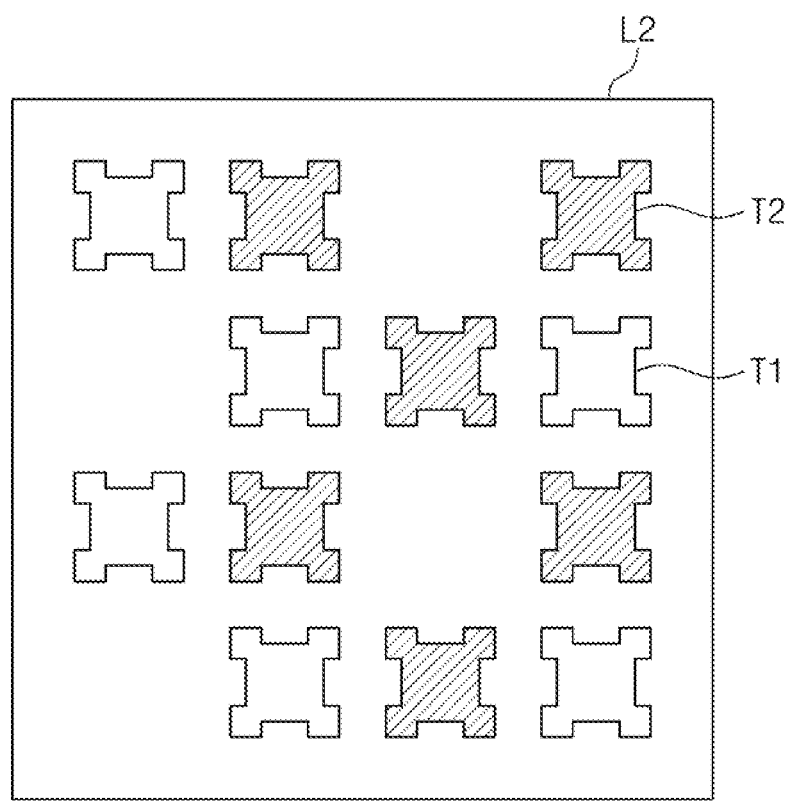
FIG. 5 illustrates an example of a second layout.

FIG. 5 illustrates an example of a second layout L2. Referring to FIGS. 4 and 5, patterns of the second layout L2 of FIG. 5 may be in the shape of deformation of the patterns of the first layout L1 of FIG. 4. According to an example embodiment, the second layout L2 may correspond to a layer that is obtained by applying process proximity correction to the first layout L1. The second layout L2 may be a target layout to be obtained in an after development inspection (ADI).

According to an example embodiment, patterns are illustrated in FIGS. 4 and 5 as being deformed in the same shape. However, the above example is only for conveying the technical idea of the disclosure easily, and as such, the disclosure is not limited to the illustration in FIGS. 4 and 5. According to another example embodiment, patterns may be deformed in different shapes.

Figure 6:
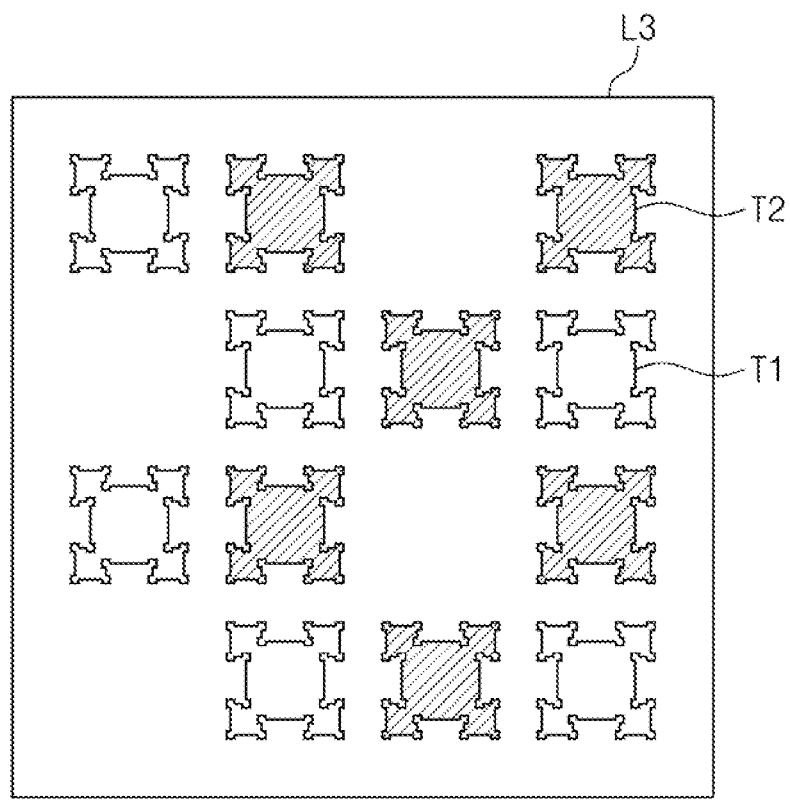
FIG. 6 illustrates an example of a third layout.

FIG. 6 illustrates an example of a third layout L3. Referring to FIGS. 5 and 6, patterns of the third layout L3 of FIG. 6 may be in the shape of deformation of the patterns of the second layout L2 of FIG. 5. According to an example embodiment, the third layout L3 may correspond to a layer that is obtained by applying optical proximity correction to the second layout L2. The third layout L3 may be a layout for a photo mask.

According to an example embodiment, patterns are illustrated in FIGS. 5 and 6 as being deformed in the same shape. However, the above example is only for conveying the technical idea of the disclosure easily, and as such, the disclosure is not limited to the illustrated in FIGS. 5 and 6. According to another example embodiment, patterns may be deformed in different shapes.

The process of generating the second layout L2 of FIG. 5 from the first layout L1 of FIG. 4 may be the process proximity correction (hereinafter referred to as "PPC"). According to an example embodiment, the PPC may be performed using a rule-based approach. The rule-based PPC may depend on edge information of patterns, such as a width and a space.

For another example, the PPC may be performed using a model-based approach. The model-based PPC may be performed by using a pixel-based image of a layout. The model-based PPC may process an image to predict a critical dimension (C) and may perform correction depending on a prediction result.

The amount of computations that the rule-based PPC performs is smaller than the amount of computations that the model-based PPC performs. However, because the amount of information that the rule-based PPC uses is smaller than the amount of information that the model-based PPC uses, the accuracy of the rule-based PPC may be lower than the accuracy of the model-based PPC. In contrast, because the amount of information that the model-based PPC uses is greater than the amount of information that the rule-based PPC uses, the accuracy of the model-based PPC may be higher than the accuracy of the rule-based PPC. However, the amount of computation of the model-based PPC may be greater than the amount of computation of the rule-based PPC.

The semiconductor process proximity correction module 200 according to an example embodiment of the present disclosure may perform machine learning or deep learning-based correction based on features of patterns of a layer and thus may perform the PPC with the improved accuracy and the amount of computation reduced.

According to an example embodiment, the patterns of the first type T1 and the patterns of the second type T2 may be implemented through different multiple patterning processes. In the etching process of the patterns of the first type T1, the mutual influence between the patterns of the first type T1 may be greater than the influence coming from the etching process of the patterns of the second type T2. Likewise, in the etching process of the patterns of the second type T2, the mutual influence between the patterns of the second type T2 may be greater than the influence coming from the etching process of the patterns of the first type T1.

The semiconductor process proximity correction module 200 according to an example embodiment of the present disclosure may perform machine learning or deep learning-based process proximity correction by applying features of the etching process of the patterns of the first type T1 and features of the etching process of the patterns of the second type T2 independently of each other in the multiple patterning processes. Accordingly, the features of the etching process of the patterns of the first type T1 and the features of the etching process of the patterns of the second type T2 may be effectually applied to the process proximity correction.

The semiconductor process proximity correction module 200 according to an example embodiment of the present disclosure may commonly apply features of all patterns to perform the machine learning or deep learning-based process proximity correction. Accordingly, features that arise in common or sequentially by the etching process of the patterns of the first type T1 and the etching process of the patterns of the second type T2 while performing the multiple patterning processes may be effectually applied to the process proximity correction.

Figure 7:
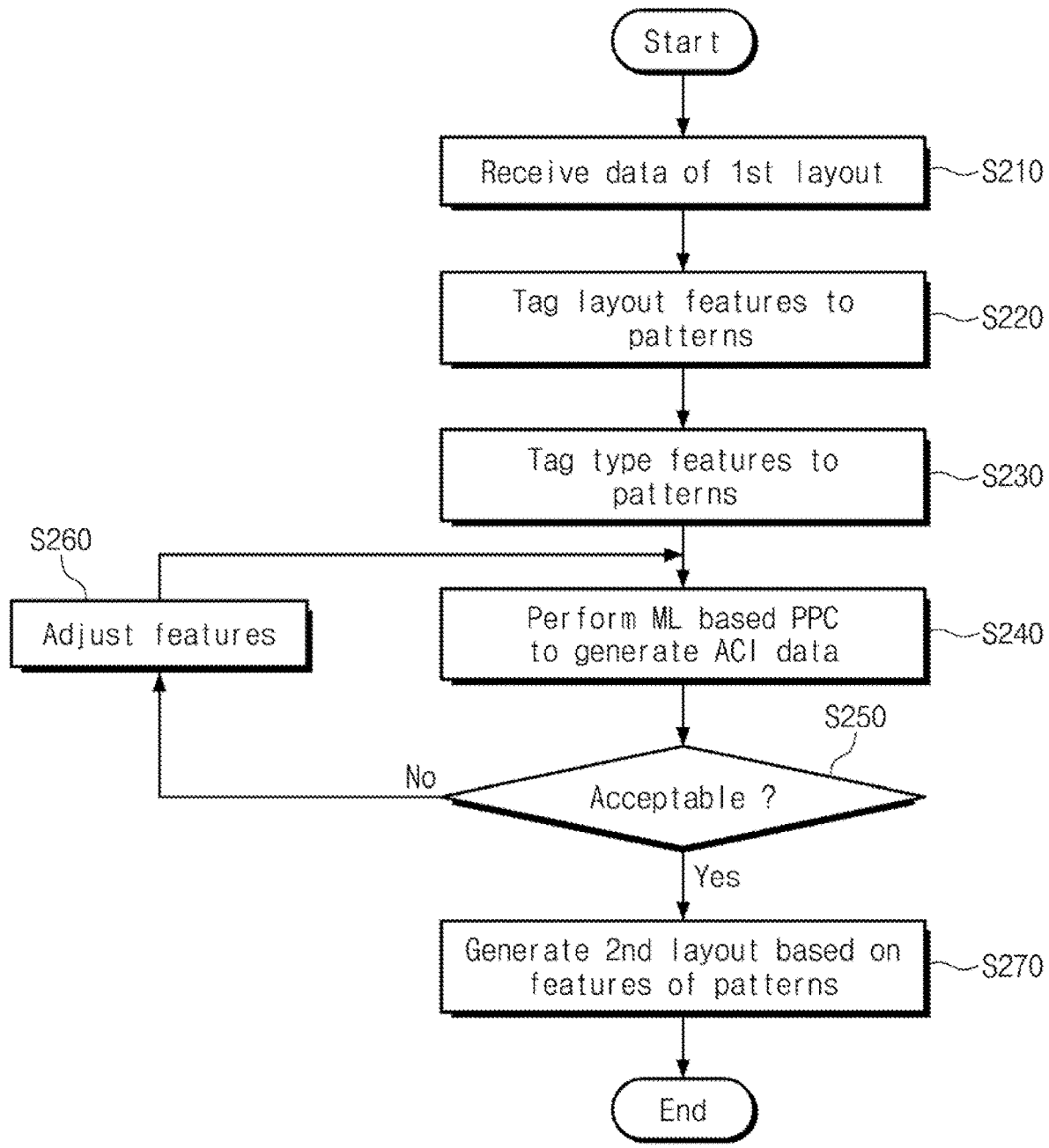
FIG. 7 illustrates an example in which a semiconductor process proximity correction module according to an example embodiment of the present disclosure executes process proximity correction.

FIG. 7 illustrates an example in which the semiconductor process proximity correction module 200 according to an example embodiment of the present disclosure executes process proximity correction. Referring to FIGS. 1, 2, and 7, according to an example embodiment, in operation S210, the semiconductor process proximity correction module 200 may receive data of a first layout. The data of the first layout may include shapes of patterns to be obtained in an after cleaning inspection (ACI).

In operation S220, the semiconductor process proximity correction module 200 may tag features to the patterns of the first layout. The semiconductor process proximity correction module 200 may extract features of patterns from the data of the first layout. For example, the semiconductor process proximity correction module 200 may extract one or more features from each of the patterns. The semiconductor process proximity correction module 200 may extract features of the same kind or features of different kinds with respect to the patterns.

The features may include a characteristic (e.g., a size and a shape) of each of the patterns, and an influence that each of the patterns experiences from adjacent neighboring patterns in the etching process. The amount of information included in features may be greater than the amount of information used in the rule-based PPC. Accordingly, machine learning-based inference (e.g., a feature-based PPC) for features may be more accurate than the rule-based PPC.

The amount of information included in features may be smaller than the amount of information used in the model-based PPC. Because the amount of information decreases, the amount of computation of the feature-based PPC may be smaller than the amount of computation of the model-based PPC. Also, because pieces of information close (or similar) to a noise are removed and pieces of information having a direct influence on each of patterns in etching are applied to inference, the feature-based PPC may be more accurate than the model-based PPC.

The semiconductor process proximity correction module 200 may tag the features extracted from each of the patterns to each of the patterns. According to an example embodiment, the features tagged to the patterns in operation S220 may be based on all the patterns of the first layout. The features in operation S220 may be called "command features".

In operation S230, the semiconductor process proximity correction module 200 may tag type features to the patterns of the first layout. The semiconductor process proximity correction module 200 may extract features of patterns of a first type and features of patterns of a second type from the data of the first layout. For example, the semiconductor process proximity correction module 200 may extract one or more features from each of the patterns of the first type or from each of the patterns of the second type.

The features of the first type may include a characteristic (e.g., a shape) of each of the patterns of the first type, and an influence that each of the patterns of the first type experiences from adjacent neighboring patterns of the first type. The features of the second type may include a characteristic (e.g., a shape) of each of the patterns of the second type, and an influence that each of the patterns of the second type experiences from adjacent neighboring patterns of the second type.

The semiconductor process proximity correction module 200 may tag the features of the first type extracted from each of the patterns of the first type to each of the patterns of the first type. The semiconductor process proximity correction module 200 may tag the features of the second type extracted from each of the patterns of the second type to each of the patterns of the second type.

In operation S240, the semiconductor process proximity correction module 200 may perform the machine learning-based process proximity correction on the features to generate data of a second layout to be obtained in an after development inspection (ADI).

In operation S250, the semiconductor process proximity correction module 200 may determine whether the generated ADI data are acceptable. When it is determined that the generated ADI data are not acceptable, in operation S260, the features may be adjusted. When it is determined that the generated ADI data are acceptable, in operation S270, the semiconductor process proximity correction module 200 may determine the second layer based on the ADI data. For example, the semiconductor process proximity correction module 200 may generate the second layout based on features (e.g., adjusted features) of patterns.

According to an example embodiment, operation S250 and operation S260 may be performed through the iteration with the optical proximity correction. For example, a third layout may be generated by applying the optical proximity correction to the second layout. When a difference of the third layout generated by ACI data and a target ACI data is greater than a threshold, the semiconductor process proximity correction module 200 may adjust features of patterns of the process proximity correction (S260) or may adjust parameters to be applied to the optical proximity correction.

For example, the semiconductor process proximity correction module 200 may adjust its own features of patterns, such as pattern sizes and pattern shapes. As its own features of patterns are adjusted, features of an influence of patterns on neighboring patterns may also be updated.

According to an example embodiment, the adjustment of features may be performed based on the machine learning. The semiconductor process proximity correction module 200 may use a difference of the generated ACI data and the target ACI data to determine adjustment values of features based on the machine learning. For example, the semiconductor process proximity correction module 200 may adjust features for each of patterns or may adjust features in units of group of patterns (e.g., in units of type or in a unit different from a type).

Figure 8:
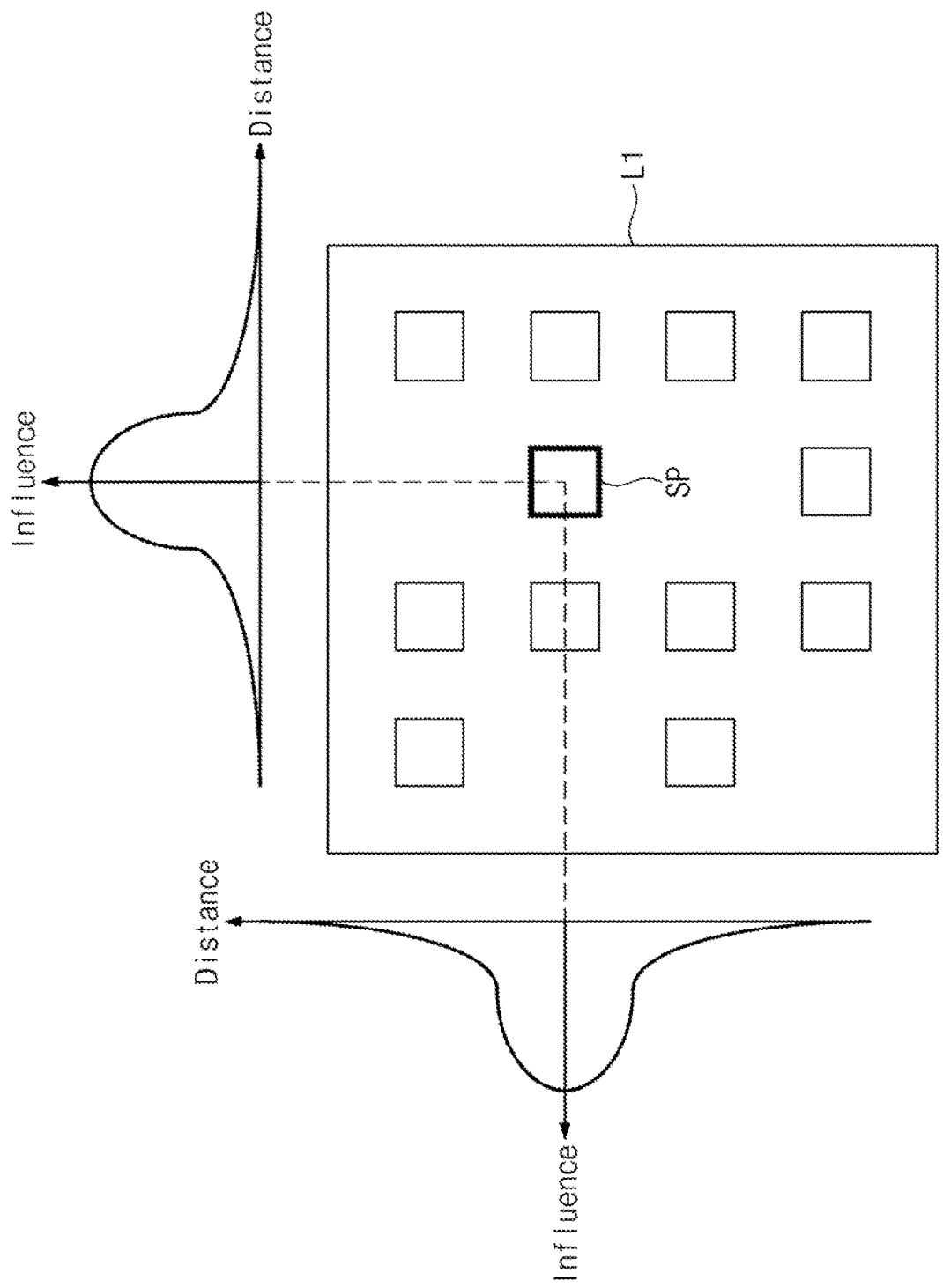
FIG. 8 illustrates a first example of extracting an influence of neighboring patterns on a specific pattern as a feature.

FIG. 8 illustrates a first example of extracting an influence of neighboring patterns on a specific pattern (e.g., a selected pattern SP) as a feature. Referring to FIG. 8, a bold line indicates a selected pattern SP. The influence of neighboring patterns, for example, the influence of neighboring patterns on the selected pattern SP may be extracted. For example, the influence of the neighboring patterns may be extracted based on Equation 1 below.

$$\sum_{i \neq i_0 \in R} A_i e^{-(\vec{r}_i - \vec{r}_0)^2 / \sigma^2}$$ [Equation 1]

In Equation 1, "R" indicates patterns in a range. The range may refer to a range that has an actual influence on the selected pattern SP, and thus may be called an "influence range" A size of the influence range may be smaller than a size of an image of a layout.

In Equation 1, "$i_0$" may represent an identification number of the selected pattern SP. "$\vec{r}_0$" may represent a position vector of the selected pattern SP in a coordinate system of an image. "$A_i$" may represent a size (or including a shape) of an i-th pattern (i being a positive integer greater than or equal to "1" and smaller than a value of "R", that is, the number of patterns). "$\vec{r}_i$" may be a position vector of the i-th pattern in the coordinate system of the image.

According to an example embodiment, the displacement of neighboring patterns may be extracted as a function of a Gaussian distribution as expressed by Equation 1 above. In Equation 1 above, "$\sigma$" may represent a weight of the function of the Gaussian distribution, for example, a decay. According to an example embodiment, a weight of the function of the Gaussian distribution may be determined depending on a characteristic of a process, for example, a temperature, a pitch, a feature size, a material, and a substance.

As a distance from the selected pattern SP increases, the influence of the displacement of the neighboring patterns may decrease based on the function of the Gaussian distribution. As the distance from the selected pattern SP decreases, the influence of the displacement of the neighboring patterns may increase based on the function of the Gaussian distribution. A feature of the displacement of the neighboring patterns may be extracted from each of patterns.

According to an example embodiment, the influence of the displacement of the neighboring patterns may be extracted from each of all patterns as the common feature. The influence of the displacement of the neighboring patterns may be extracted from each of the patterns of the first type as the feature of the first type. The influence of the displacement of the neighboring patterns may be extracted from each of the patterns of the second type as the feature of the second type.

Figure 9:
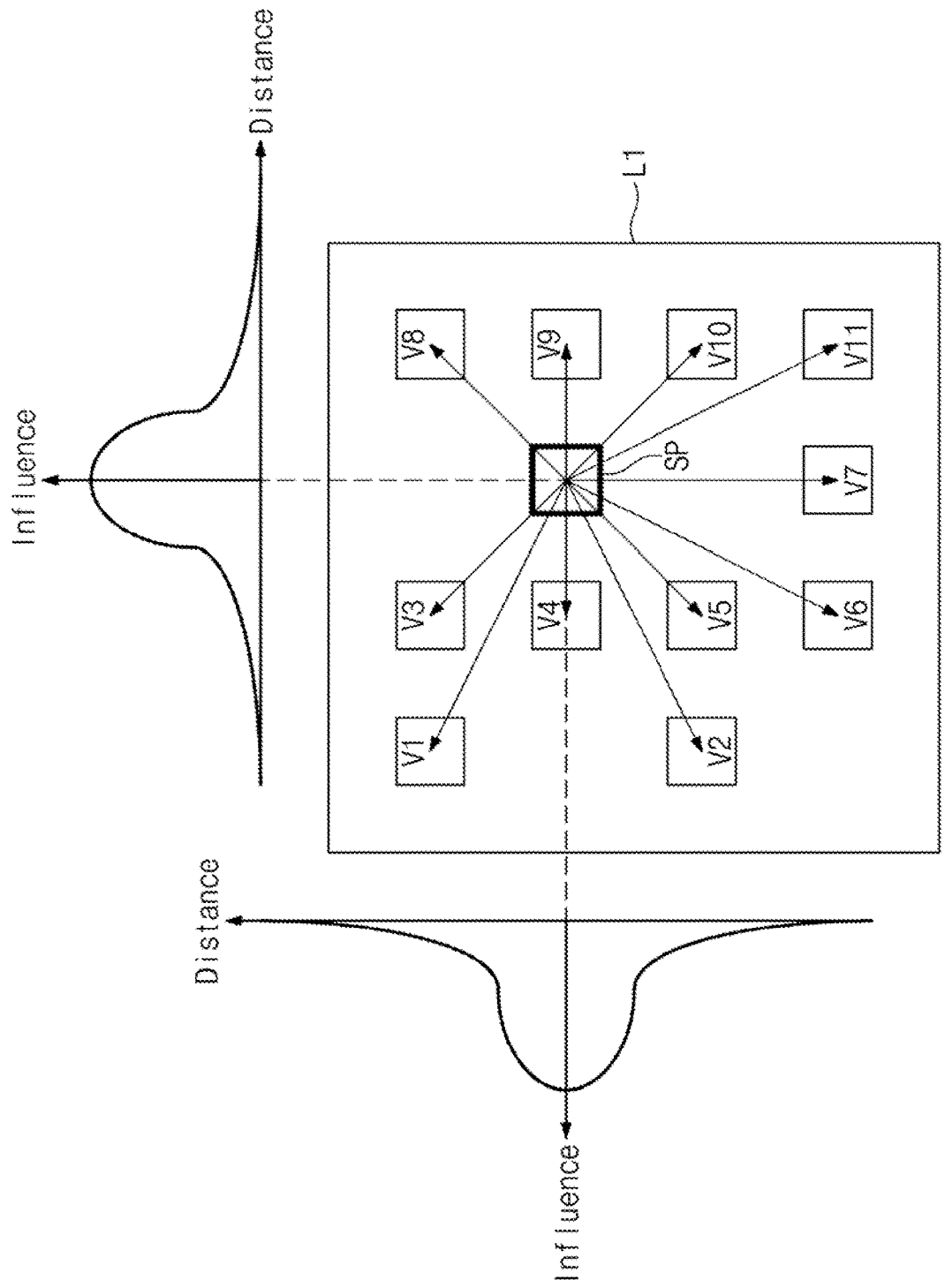
FIGS. 9 and 10 illustrate a second example of extracting an influence of neighboring patterns on a specific pattern as a feature.
Figure 10:
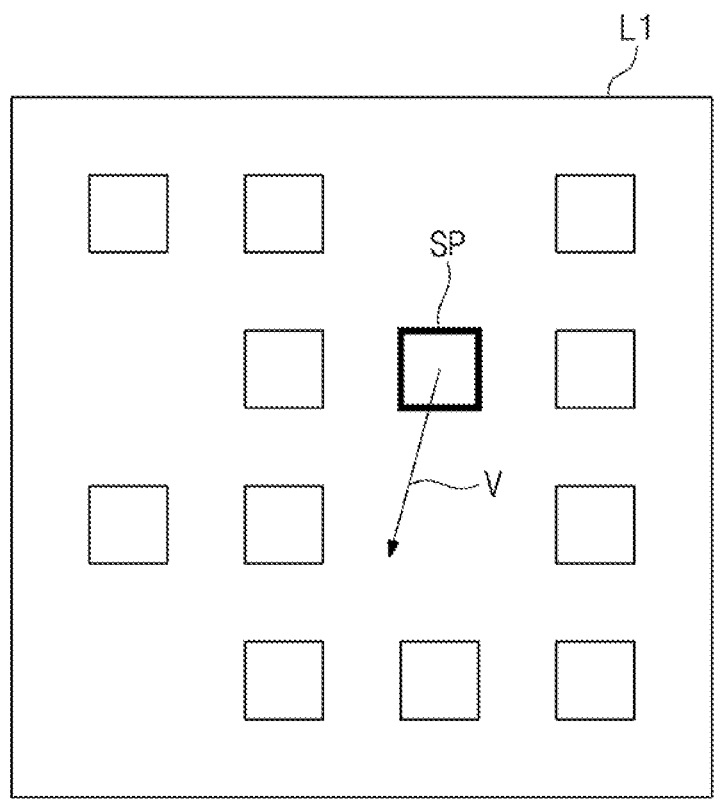

FIGS. 9 and 10 illustrate a second example of extracting an influence of neighboring patterns on a specific pattern (e.g., a selected pattern SP) as a feature. Referring to FIGS. 9 and 10, a bold line indicates the selected pattern SP. The influence of neighboring patterns, for example, the influence of an electric field applied to neighboring patterns in etching may be extracted with the center of the selected pattern SP. For example, the influence of the electric field applied to the neighboring patterns may be extracted based on Equation 2 below.

$$\left| \sum_{i \neq i_0 \in R} A_i e^{-\frac{(\vec{r}_i - \vec{r}_0)^2}{\sigma^2}} \frac{\vec{r}_i}{|\vec{r}_i|} \right|^2$$ [Equation 2]

Equation 2 may be a sum of position vectors of patterns neighboring the selected pattern SP in relation to the selected pattern SP. Magnitudes (or lengths) of position vectors of neighboring patterns may be unified to "1" so as to be replaced with a feature of the displacement of Equation 1 above.

According to an example embodiment, according to Equation 2, a sum of first to eleventh position vectors V1 to V11 illustrated in FIG. 9 may be, for example, a vector "V" of FIG. 10. A magnitude of the vector "V" of FIG. 10 may be extracted as features of the influence of the electric field.

As illustrated in FIGS. 9 and 10, the influence of the electric field applied to the neighboring patterns may be determined by a sum of position vectors of patterns, for each of the patterns, as the common feature. The influence of the electric field applied to the neighboring patterns may be determined by a sum of position vectors of the patterns of the first type, for each of the patterns of the first type as the feature of the first type. The influence of the electric field applied to the neighboring patterns may be determined by a sum of position vectors of the patterns of the second type, for each of the patterns of the second type as the feature of the second type.

Additionally, the influence of neighboring patterns on an etching skew of the selected pattern SP may be extracted based on Equation 3 below.

$$\left| \sum_{i \neq i_0 \in R} A_i e^{-(\vec{r}_i - \vec{r}_0)^2 / \sigma^2} e^{j2(\theta_i - \theta_0)} \right|^2$$ [Equation 3]

In Equation 3 above, "$\theta_0$" may represent a phase of the selected pattern SP in the coordinate system of the image, and "$\theta_i$" may represent a phase of an i-th pattern in the coordinate system of the image. According to Equation 3, a feature of the influence of the skew may be extracted by twice correcting angle information of position vectors of neighboring patterns with the center of the selected pattern SP and applying harmonics to the displacement characteristic of Equation 1 above.

According to an example embodiment, Equation 3 above shows that angle information is corrected twice, but angle information according to a feature of a process may be corrected "m" times (m being a positive integer). Also, a feature of the influence of the skew may be extracted by applying an orthogonal basis function such as Bessel, instead of applying harmonics.

In Equation 1, Equation 2 and Equation 3, the process of extracting features with reference to the polar coordinate system is described. However, a coordinate system on an image for extracting features is not limited to the polar coordinate system, and various coordinate systems may be used according to various example embodiment.

As illustrated in FIGS. 9 and 10 and expressed by Equation 3 above, the influence of skew of neighboring patterns may be determined by a sum of position vectors of patterns, for each of the patterns as the common feature. The influence of skew of the neighboring patterns may be determined by a sum of position vectors of the patterns of the first type, for each of the patterns of the first type as the feature of the first type. The influence of skew of the neighboring patterns may be determined by a sum of position vectors of the patterns of the second type, for each of the patterns of the second type as the feature of the second type.

Figure 11:
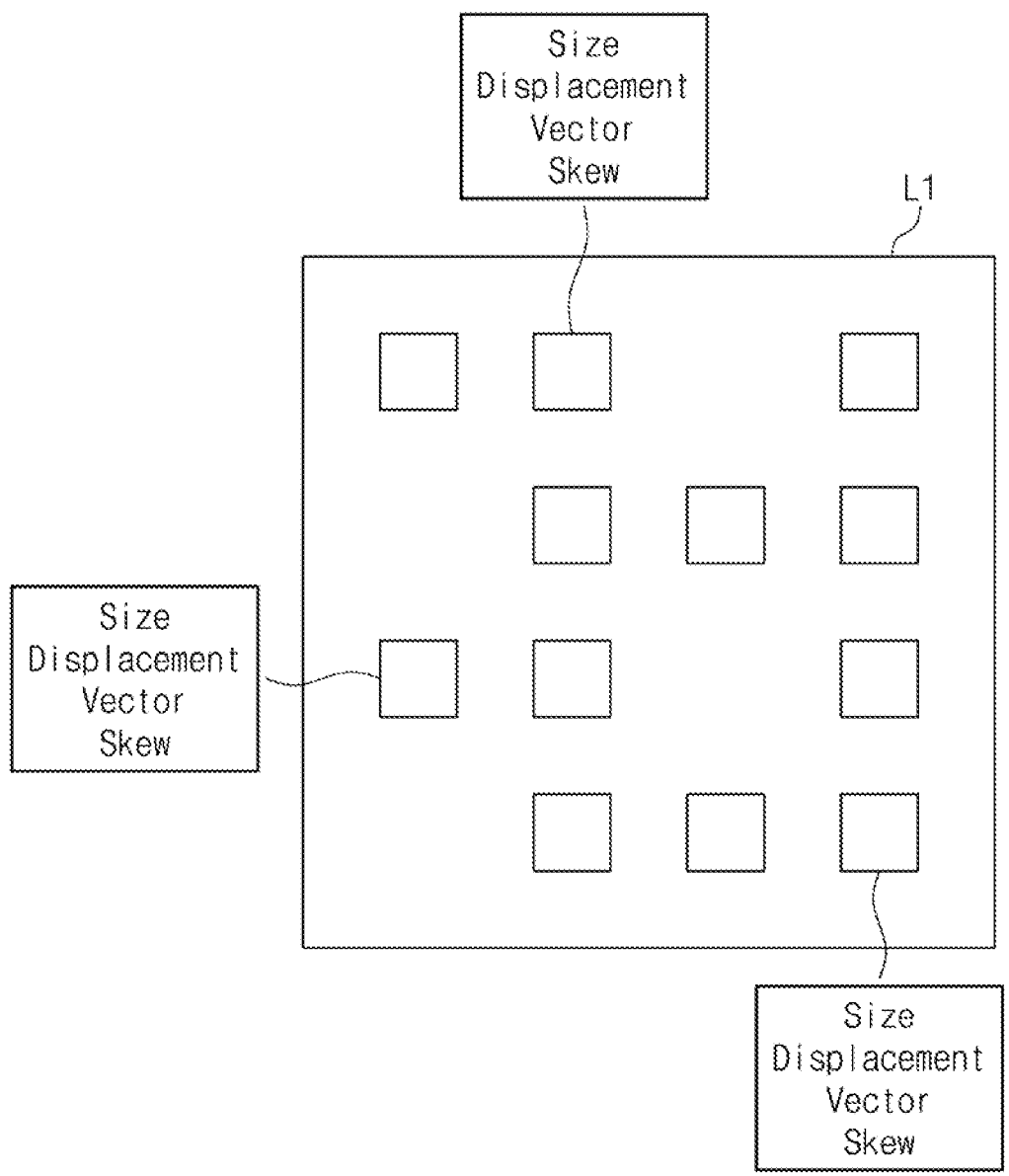
FIG. 11 illustrates an example in which features are tagged to patterns of a first layout.

FIG. 11 illustrates an example in which features are tagged to patterns of the first layout L1. Referring to FIG. 11, a feature of a size (or including a shape), a displacement feature, a vector feature of an electric field, and a skew feature may be tagged to each of patterns. The semiconductor process proximity correction module 200 may perform the machine learning-based process proximity correction based on the features of the patterns.

For example, the semiconductor process proximity correction module 200 may perform process proximity correction based on regression including linear regression, non-linear regression, etc.

Figure 12:
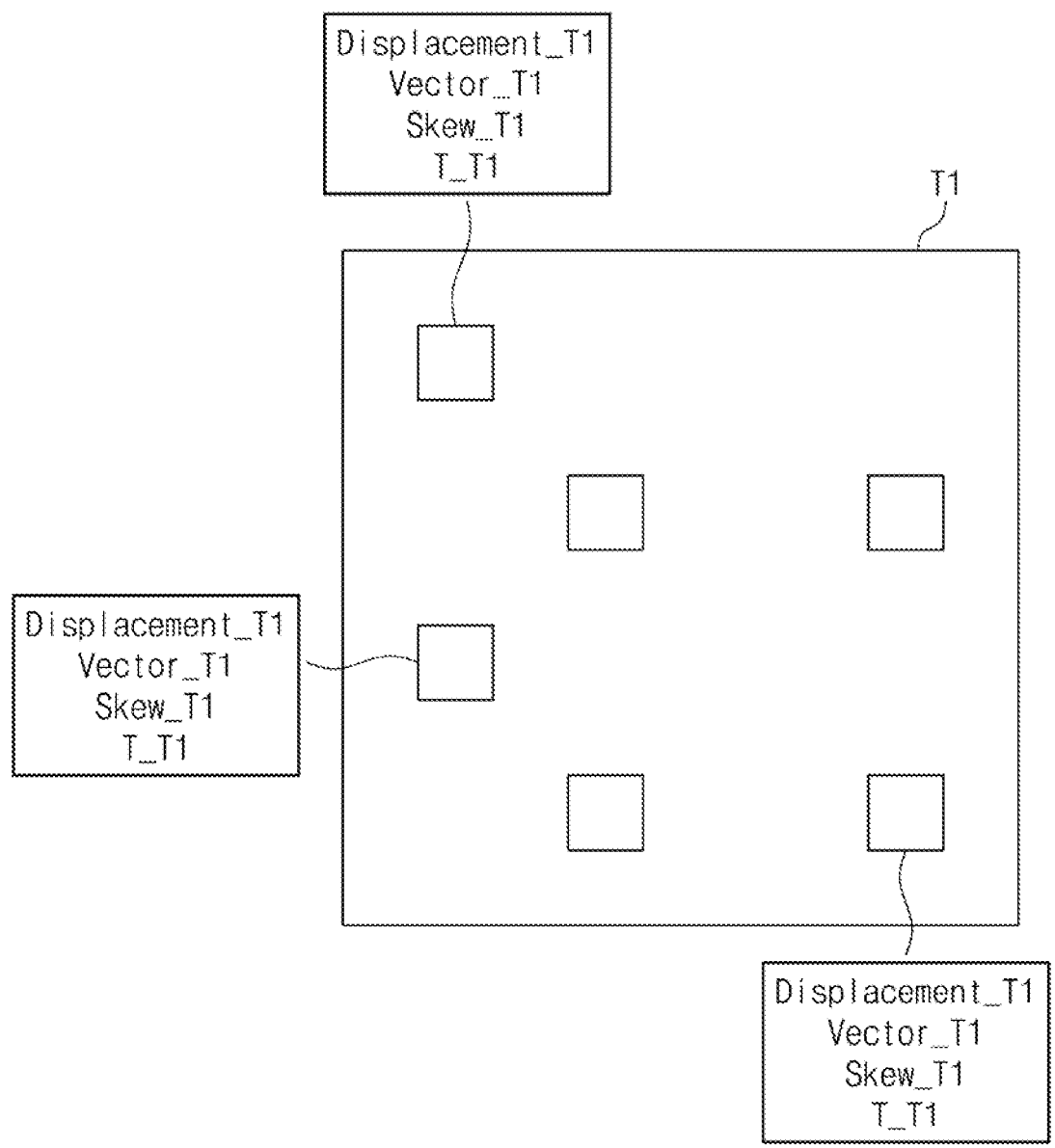
FIG. 12 illustrates an example in which features are tagged to patterns of a first type in a first layout.

FIG. 12 illustrates an example in which features are tagged to patterns of the first type T1 in the first layout L1. Referring to FIGS. 11 and 12, a displacement feature Displacement_T1 of the patterns of the first type T1, a vector feature Vector_T1 of an electric field of the patterns of the first type T1, and a skew feature Skew_T1 of the patterns of the first type T1 may be tagged to each of the patterns of the first type T1.

Each of the patterns of the first type T1 may further include a type feature T_T1 indicating the first type T1. According to an example embodiment, the type feature T_T1 may include information of an order of an etching process, which is associated with the patterns of the first type T1, from among the multiple patterning processes. The semiconductor process proximity correction module 200 may perform the machine learning-based process proximity correction based on the features of the patterns of the first type T1.

Figure 13:
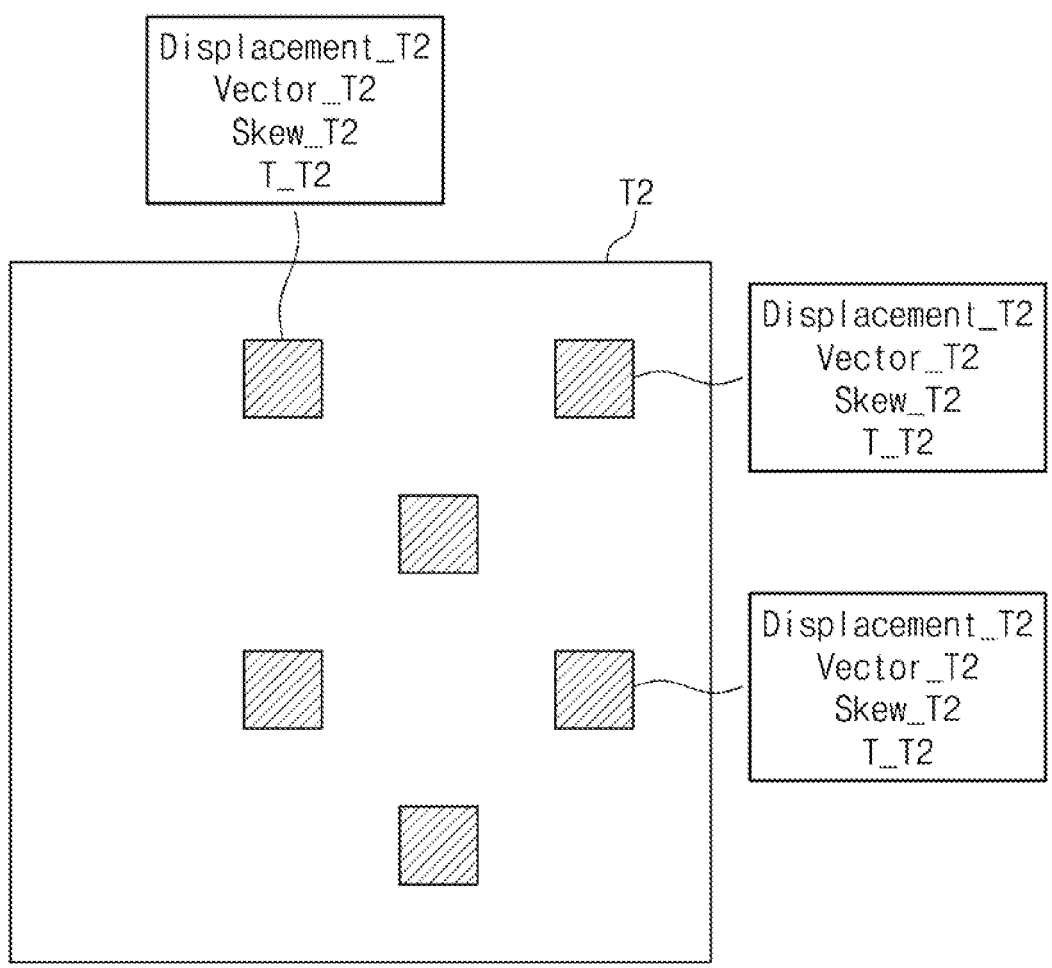
FIG. 13 illustrates an example in which features are tagged to patterns of a second type in a first layout.

FIG. 13 illustrates an example in which features are tagged to patterns of the second type T2 in the first layout L1. Referring to FIGS. 11 and 13, a displacement feature Displacement_T2 of the patterns of the second type T2, a vector feature Vector_T2 of an electric field of the patterns of the second type T2, and a skew feature Skew_T2 of the patterns of the second type T2 may be tagged to each of the patterns of the second type T2.

Each of the patterns of the second type T2 may further include a type feature T_T2 indicating the second type T2. According to an example embodiment, the type feature T_T2 may include information of an order of an etching process, which is associated with the patterns of the second type T2, from among the multiple patterning processes. The semiconductor process proximity correction module 200 may perform the machine learning-based process proximity correction based on the features of the patterns of the second type T2.

According to an example embodiment, the semiconductor process proximity correction module 200 may perform process proximity correction based on the features of FIG. 11, the features of the first type T1 of FIG. 12, and the feature of the second type T2 of FIG. 13. Because a feature of a size (or shape) of each of patterns is applied to the features of FIG. 11, features of a size (or shape) may be omitted at the features of the first type T1 of FIG. 12 and the feature of the second type T2 of FIG. 13.

As described with reference to FIGS. 11, 12 and 13, each of the patterns of the first layout L1 may be tagged to a feature of its own size (or shape), a displacement feature of neighboring patterns of all the patterns, a vector feature of an electric field of the neighboring patterns of all the patterns, a skew feature of the neighboring patterns of all the patterns, a displacement feature of neighboring patterns among patterns whose type is identical to its own type, a vector feature of the electric field of the neighboring patterns among the patterns whose type is identical to its own type, a skew feature of the neighboring patterns among the patterns whose type is identical to its own type, and a feature of its own type.

Figure 14:
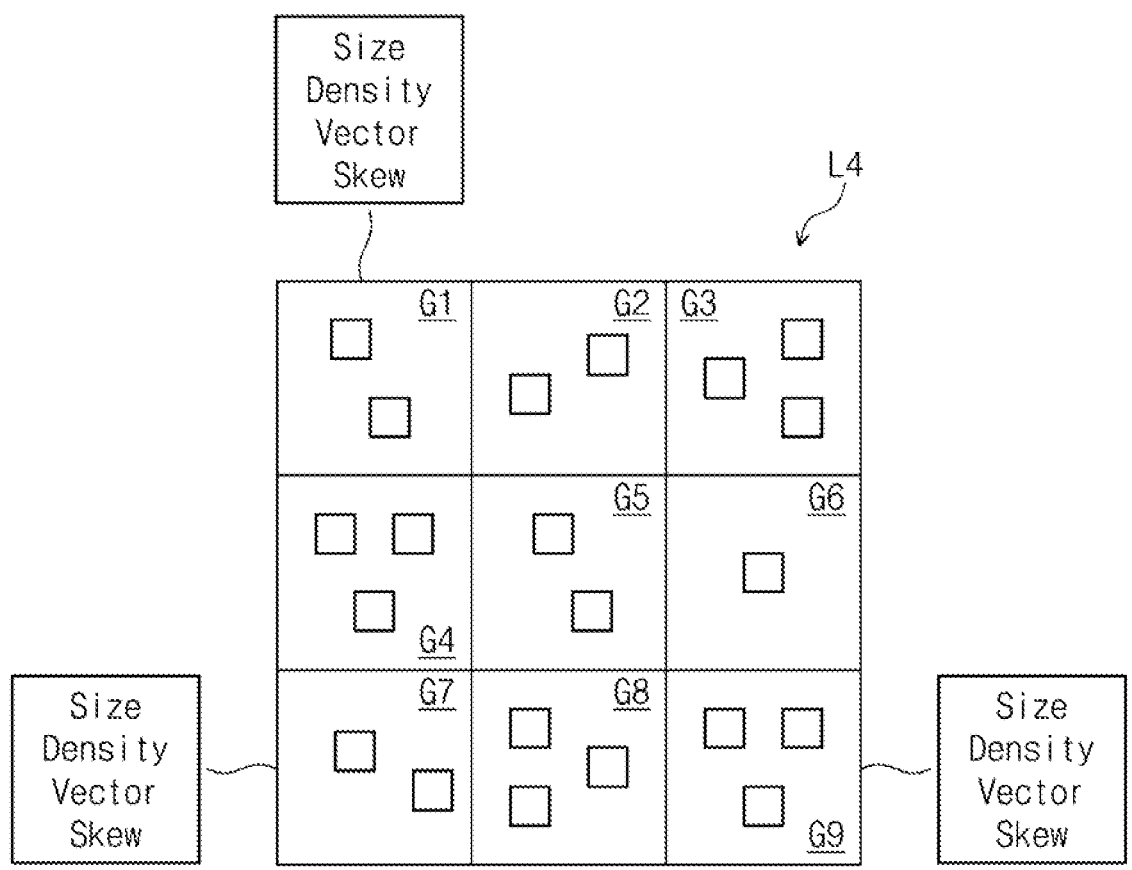
FIG. 14 shows an example of long-range process proximity correction according to an example embodiment of the present disclosure.

FIG. 14 illustrates an example in which features are tagged to grids of a fourth layout L4. Referring to FIG. 14, a feature of a size (or including a shape) of patterns, a feature of a density (or the number) of patterns, a displacement feature of the grids, a vector feature of an electric field of the grids, and a skew feature of the grids may be tagged to each of the grids. The semiconductor process proximity correction module 200 may perform the machine learning-based inference based on the features of the grids.

FIG. 14 shows an example of long-range process proximity correction according to an example embodiment of the present disclosure. Referring to FIGS. 1 and 14, the fourth layout L4 may correspond to target ACI data. Before generating ACI data, the semiconductor process proximity correction module 200 may select a long-range region of the fourth layout L4, on which the process proximity correction is to be performed, and may divide the selected long-range region to generate grids G1 to G9.

The semiconductor process proximity correction module 200 may extract features of each grid instead of extracting features of each pattern. For example, features of each grid may include a characteristic of each grid itself (e.g., a size or shape of patterned included therein and the number (density) of patterns included therein).

A feature of a size (or including a shape) of patterns, a feature of a density (or the number) of patterns, a displacement feature of the grids, a vector feature of an electric field of the grids, and a skew feature of the grids may be tagged to each of the grids.

The features of each grid may include the influence that is transferred from neighboring grids to each grid. In Equation 1, Equation 2 and Equation 3, the number (or density) of pattern included in each grid may be used instead of the size "$A_i$". The semiconductor process proximity correction module 200 may perform the machine learning-based inference based on the features of the grids.

Each grid may include patterns of the first type T1 and patterns of the second type T2. As described with reference to FIGS. 12 and 13, a density feature of the patterns of the first type T1, a vector feature of an electric field of the patterns of the first type T1, a skew feature of the patterns of the first type T1, a density feature of the patterns of the second type T2, a vector feature of an electric field of the patterns of the second type T2, and a skew feature of the patterns of the second type T2 may be tagged to each grid.

The semiconductor process proximity correction module 200 may perform process proximity correction based on a combination of the short-range process proximity correction described with reference to FIGS. 7 to 13 and the long-range process proximity correction described with reference to FIG. 14.

Figure 15:
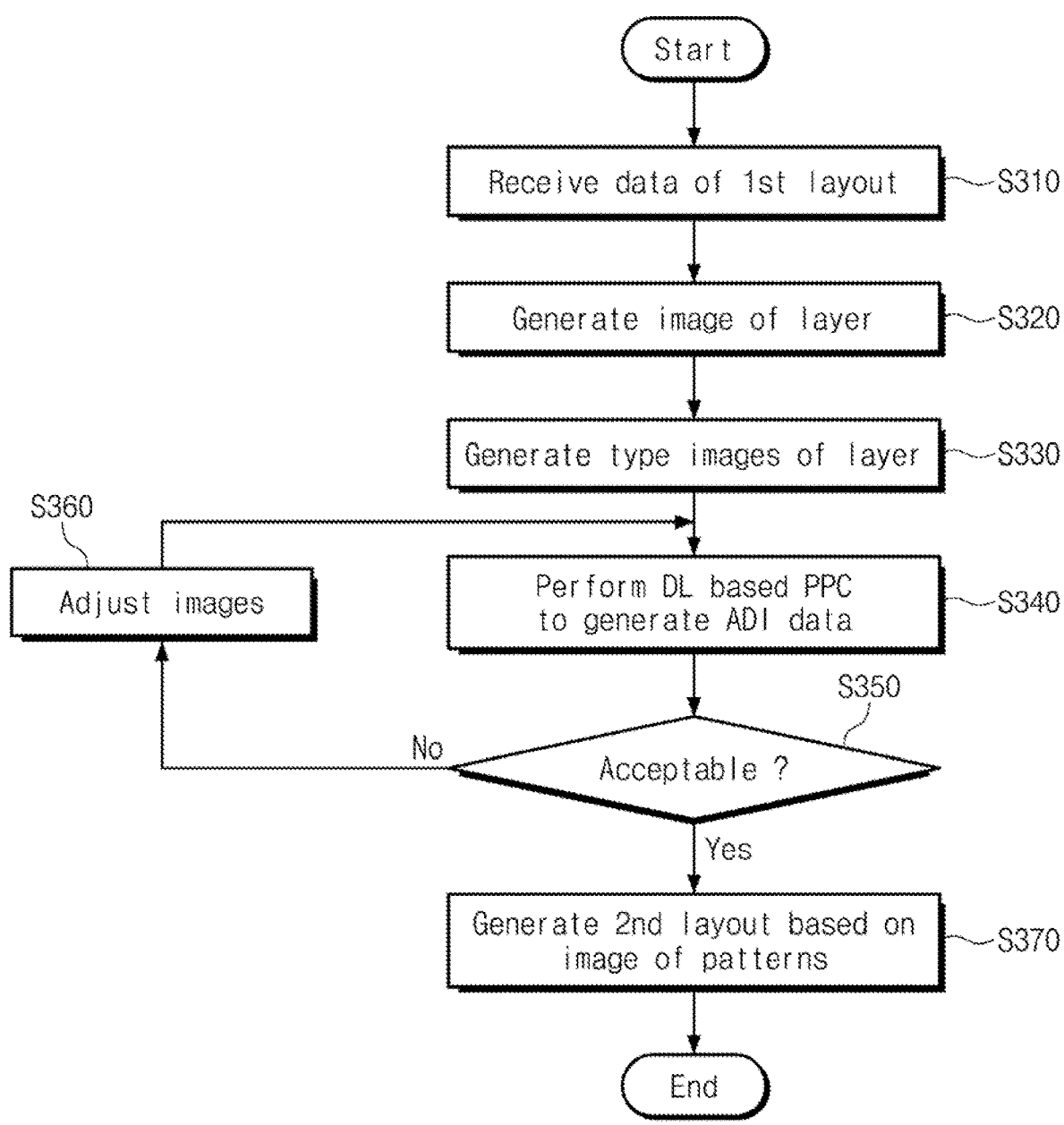
FIG. 15 illustrates another example in which a semiconductor process proximity correction module according to an example embodiment of the present disclosure executes process proximity correction.

FIG. 15 illustrates another example in which the semiconductor process proximity correction module 200 according to an example embodiment of the present disclosure executes process proximity correction. Referring to FIGS. 1, 2, and 15, in operation S310, the semiconductor process proximity correction module 200 may receive data of a first layout. The data of the first layout may include shapes of patterns that are wanted to obtain in ACI (After Cleaning Inspection).

In operation S320, the semiconductor process proximity correction module 200 may generate an image of patterns of the first layout. According to an example embodiment, the image in operation S320 may be based on all the patterns of the first layout. The image in operation S320 may be called a "common image".

In operation S330, the semiconductor process proximity correction module 200 may generate an image of a first type associated with patterns of a first type in the first layout and may generate an image of a second type associated with patterns of a second type in the first layout.

In operation S340, the semiconductor process proximity correction module 200 may perform the deep learning-based process proximity correction on the images to generate data of a second layout of the after development inspection (ADI) which is expected. According to an example embodiment, the semiconductor process proximity correction module 200 may perform process proximity correction based on the common image, the image of the first type, and the image of the second type. For another example, the semiconductor process proximity correction module 200 may perform process proximity correction based on the image of the first type and the image of the second type.

In operation S350, the semiconductor process proximity correction module 200 may determine whether the generated ADI data are acceptable. When it is determined that the generated ADI data are not acceptable, in operation S360, the common image, the image of the first type, or the image of the second type may be adjusted. When it is determined that the generated ADI data are acceptable, in operation S370, the semiconductor process proximity correction module 200 may determine a second layout based on the ADI data. For example, the semiconductor process proximity correction module 200 may generate the second layout based on an image of patterns (e.g., an adjusted image).

According to an example embodiment, operation S350 and operation S360 may be performed through the iteration with the optical proximity correction. For example, a third layout may be generated by applying the optical proximity correction to the second layout. When a difference of the third layout generated by ACI data and a target ACI data is greater than a threshold, the semiconductor process proximity correction module 200 may adjust images of patterns of the process proximity correction (S360) or may adjust parameters to be applied to the optical proximity correction. For example, the semiconductor process proximity correction module 200 may adjust images of patterns, such as pattern sizes and pattern shapes.

According to an example embodiment, the adjustment of images may also be performed based on the deep learning. The semiconductor process proximity correction module 200 may use a difference of the generated ACI data and the target ACI data to determine adjustment values of features based on the deep learning. For example, the semiconductor process proximity correction module 200 may adjust features for each of patterns or may adjust features in units of group of patterns (e.g., in units of type or in a unit different from a type).

According to an example embodiment, the semiconductor process proximity correction module 200 may generate an ADI image based on the convolutional neural network (CNN). In an embodiment, the semiconductor process proximity correction module 200 may generate an ADI image based on the generative adversarial network (GAN).

Figure 16:
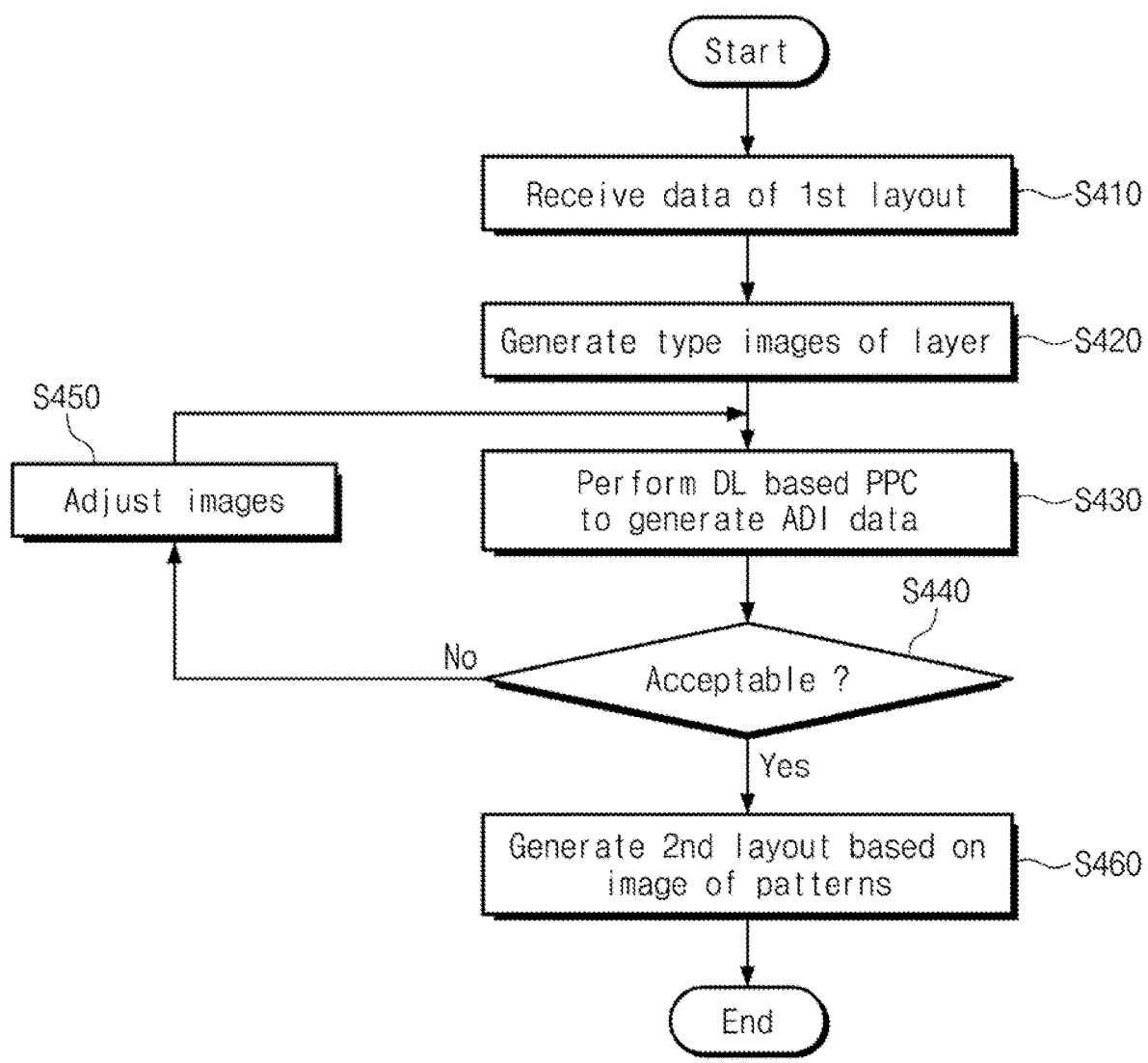
FIG. 16 illustrates another example in which a semiconductor process proximity correction module according to an example embodiment of the present disclosure executes process proximity correction.

FIG. 16 illustrates another example in which the semiconductor process proximity correction module 200 according to an example embodiment of the present disclosure executes process proximity correction. Operation S410 of FIG. 16 may correspond to operation S310 of FIG. 15. Operation S420, operation S430, operation S440, operation S450, and operation S460 of FIG. 16 may correspond to operation S330, operation S340, operation S350, operation S360, and operation S370 of FIG. 15, respectively.

That is, the semiconductor process proximity correction module 200 may perform process proximity correction based on the image of the first type and the image of the second type, without using a common image of patterns of a first layout.

In the above example embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above embodiments, components according to example embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to the present disclosure, machine learning or deep learning-based process proximity correction is performed based on features of patterns of a multiple patterning process, and a layout is generated as a result of the process proximity correction. Accordingly, there are a method and a computing device for generating a layout, which is used to manufacture a semiconductor device, such that a reliability is improved, the amount of computation is reduced, and a resolution is improved.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A method for manufacturing a semiconductor device, the method comprising:
   receiving a first layout including a plurality of patterns of the semiconductor device;
   generating a second layout by performing machine learning-based process proximity correction (PPC) based on process features of the plurality of patterns of the first layout, the plurality of patterns comprising first-type patterns having a first characteristic and second-type patterns having a second characteristic different from the first characteristic;
   generating a third layout by performing optical proximity correction (OPC) on the second layout; and performing a multiple patterning process based on the third layout, wherein first process features of the first-type patterns comprise an influence that each of the first-type patterns experiences from neighboring patterns of the first-type patterns, wherein second process features of the second-type patterns comprise an influence that each of the second-type patterns experiences from neighboring patterns of the second-type patterns, wherein the performing the multiple patterning process comprises:

performing a first patterning process of etching the first-type patterns; and performing a second patterning process of etching the second-type patterns, wherein the performing the machine learning-based process proximity correction comprises:

performing a first machine learning-based process proximity correction based on only the first process features of the first-type patterns, among the first-type patterns and the second-type patterns, and performing a second machine learning-based process proximity correction based on only the second process features of the second-type patterns, among the first-type patterns and the second-type patterns, and displacement features of the first-type patterns, and wherein the first machine learning-based process proximity correction and the second machine learning-based process proximity correction are separately performed.

2. The method of claim 1, wherein the first process features of the first-type patterns include sizes of the first-type patterns, and wherein the second process features of the second-type patterns include sizes of the second-type patterns.

3. The method of claim 1, wherein the first process features of the first-type patterns include first displacement information of the first-type patterns, and wherein the second process features of the second-type patterns include second displacement information of the second-type patterns.

4. The method of claim 3, wherein the first displacement information of the first-type patterns includes a first degree to which an influence that a neighboring first-type pattern neighboring a first-type pattern selected from the first-type patterns has on the selected first-type pattern decreases as a distance between the selected first-type pattern and the neighboring first-type pattern increases, and wherein the second displacement information of the second-type patterns includes a second degree to which an influence that a neighboring second-type pattern neighboring a second-type pattern selected from the second-type patterns has on the selected second-type pattern decreases as a distance between the selected second-type pattern and the neighboring second-type pattern increases.

5. The method of claim 4, wherein the first degree to which the influence decreases at the first-type patterns or the second degree to which the influence decreases at the second-type patterns is based on a Gaussian distribution.

6. The method of claim 1, wherein the first process features of the first-type patterns include first electric field information of a first electric field applied in the patterning of the first-type patterns, and wherein the second process features of the second-type patterns include second electric field information of a second electric field applied in the patterning of the second-type patterns.

7. The method of claim 6, wherein the first electric field information of the first electric field includes a sum of first position vectors of neighboring first-type patterns, which neighbor a selected first-type pattern from among the first-type patterns, in relation to the selected first-type pattern, and wherein the second electric field information of the second electric field includes a sum of second position vectors of neighboring second-type patterns, which neighbor a selected second-type pattern from among the second-type patterns, in relation to the selected second-type pattern.

8. The method of claim 7, wherein first magnitudes of the first position vectors decrease as a first distance between the selected first-type pattern and the neighboring first-type patterns increases, and wherein second magnitudes of the second position vectors decrease as a second distance between the selected second-type pattern and the neighboring second-type patterns increases.

9. The method of claim 8, wherein the first magnitudes of the first position vectors or the second magnitudes of the second position vectors are based on a Gaussian distribution.

10. The method of claim 1, wherein the first process features of the first-type patterns include a first skew occurring in patterning of the first-type patterns, and wherein the second process features of the second-type patterns include a second skew occurring in patterning of the second-type patterns.

11. The method of claim 10, wherein the first skew includes harmonics correcting angles of position vectors of neighboring first-type patterns, which neighbor a first-type pattern selected from the first-type patterns, in relation to the selected first-type pattern "m" times, wherein the second skew includes harmonics correcting angles of position vectors of neighboring second-type patterns, which neighbor a second-type pattern selected from the second-type patterns, in relation to the selected second-type pattern "m" times, and wherein m is a positive integer.

12. The method of claim 1, wherein the generating the second layout comprises:

receiving data of the first layout;

extracting the first process features of the first-type patterns from the data of the first layout;

extracting the second process features of the second-type patterns from the data of the first layout; and generating an after development inspection (ADI) layout by performing the machine learning-based process proximity correction based on the first process features of the first-type patterns and the second process features of the second-type patterns.

13. The method of claim 12, wherein the generating the second layout comprises:

adjusting the first process features of the first-type patterns based on a difference between the ADI layout and the first layout;

adjusting the second process features of the second-type patterns based on a difference between the ADI layout and the first layout; and generating an adjusted ADI layout as the second layout by performing the machine learning-based process proximity correction based on the adjusted first process features of the first-type patterns and the adjusted second process features of the second-type patterns.

14. The method of claim 1, wherein the machine learning-based process proximity correction is based on regression.

15. The method of claim 1, wherein the machine learning-based process proximity correction is further based on the process features of the plurality of patterns.

16. The method of claim 1, wherein the machine learning-based process proximity correction is performed further based on at least one of long-range process features of the plurality of patterns, long-range process features of the first-type patterns, and long-range process features of the second-type patterns.

17. A method for manufacturing a semiconductor device, the method comprising:
receiving a first layout including a plurality of patterns of the semiconductor device, the plurality of patterns comprising first-type patterns having a first characteristic and second-type patterns having a second characteristic different from the first characteristic;
generating a first image corresponding to the first-type patterns among the plurality of patterns of the first layout;
generating a second image corresponding to the second-type patterns among the plurality of patterns of the first layout;
generating a second layout by performing deep learning-based process proximity correction (PPC) based on the first image and the second image;
generating a third layout by performing optical proximity correction (OPC) on the second layout; and
performing a multiple patterning process based on the third layout,
wherein first process features of the first-type patterns comprise an influence that each of the first-type patterns experiences from neighboring patterns of the first-type patterns,
wherein second process features of the second-type patterns comprise an influence that each of the second-type patterns experiences from neighboring patterns of the second-type patterns,
wherein performing the multiple patterning process comprises:
performing a first patterning process of etching the first-type patterns; and
performing a second patterning process of etching the second-type patterns,
wherein the performing the deep learning-based PPC comprises:
performing a first deep learning-based process proximity correction based on only the first process features of the first-type patterns, among the first-type patterns and the second-type patterns, and
performing a second deep learning-based process proximity correction based on only the second process features of the second-type patterns, among the first-type patterns and the second-type patterns, and displacement features of the first-type patterns, and wherein the first deep learning-based process proximity correction and the second deep learning-based process proximity correction are separately performed.

18. The method of claim 17, further comprising:
generating a third image corresponding to the plurality of patterns of the first layout.

19. The method of claim 18, wherein the generating the second layout comprises:
generating the second layout by performing the deep learning-based process proximity correction (PPC) based on the first image, the second image, and the third image.

20. A computing device comprising:
a memory storing instructions; and
one or more processors configured to execute the instructions to:
receive a first layout including a plurality of patterns of a semiconductor device;
generate a second layout by performing machine learning-based process proximity correction (PPC) based on features of the plurality of patterns of the first layout, the plurality of patterns comprising first-type patterns having a first characteristic and second-type patterns having a second characteristic different from the first characteristic;
generate a third layout by performing optical proximity correction (OPC) on the second layout; and
perform a multiple patterning process based on the third layout,
wherein first process features of the first-type patterns comprise an influence that each of the first-type patterns experiences from neighboring patterns of the first-type patterns,
wherein second process features of the second-type patterns comprise an influence that each of the second-type patterns experiences from neighboring patterns of the second-type patterns,
wherein the multiple patterning process comprises:
a first patterning process of etching the first-type patterns, and
a second patterning process of etching the second-type patterns,
wherein the performing the machine learning-based process proximity correction comprises:
performing a first machine learning-based process proximity correction based on only the first process features of the first-type patterns, among the first-type patterns and the second-type patterns, and
performing a second machine learning-based process proximity correction based on only the second process features of features of the second-type patterns, among the first-type patterns and the second-type patterns, and a displacement features of the first-type patterns, and
wherein the first machine learning-based process proximity correction and the second machine learning-based process proximity correction are separately performed.

* * * * *